United States Patent
Kim et al.

(10) Patent No.: US 12,210,059 B2
(45) Date of Patent: Jan. 28, 2025

(54) TEST ELEMENT GROUP AND TEST METHOD

(71) Applicant: Samsung Electronics Co., Ltd., Suwon-si (KR)

(72) Inventors: Jeongha Kim, Hwaseong-si (KR); Dongsoo Kang, Seongnam-si (KR); Jaeboong Lee, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 246 days.

(21) Appl. No.: 17/825,296

(22) Filed: May 26, 2022

(65) Prior Publication Data

US 2022/0381823 A1 Dec. 1, 2022

(30) Foreign Application Priority Data

May 27, 2021 (KR) .......................... 10-2021-0068607

(51) Int. Cl.
*G01R 31/317* (2006.01)
(52) U.S. Cl.
CPC .............................. *G01R 31/31727* (2013.01)
(58) Field of Classification Search
CPC .............................................. G01R 31/31727
See application file for complete search history.

(56) References Cited

U.S. PATENT DOCUMENTS

| | | | |
|---|---|---|---|
| 5,410,263 A | 4/1995 | Waizman | |
| 7,208,934 B2 | 4/2007 | King et al. | |
| 7,279,995 B2 | 10/2007 | Kernahan et al. | |
| 7,408,371 B2 | 8/2008 | Kim et al. | |
| 7,656,244 B2 | 2/2010 | McCorquodale et al. | |
| 8,164,966 B2 * | 4/2012 | Stratz | G01R 31/31727 365/233.5 |
| 9,632,109 B2 * | 4/2017 | Dibattista | G06F 30/392 |
| 10,605,861 B2 * | 3/2020 | Chen | G01R 31/31727 |
| 2014/0376683 A1 | 12/2014 | Goldblatt et al. | |

FOREIGN PATENT DOCUMENTS

KR 10-0801054 B1 2/2008

* cited by examiner

*Primary Examiner* — Reena Aurora
(74) *Attorney, Agent, or Firm* — Harness, Dickey & Pierce, P.L.C.

(57) ABSTRACT

A test element group (TEG) disposed adjacent to at least one memory chip on a wafer includes a ring oscillator configured to output a clock signal based on a direct current (DC) signal received through a first pad and from a test device, a first divider configured to divide the clock signal and to output a first divided signal, and a sequential circuit set configured to receive the clock signal and the first divided signal, to generate a test signal based on the clock signal and the first divided signal, and to output the test signal to the test device through a second pad. The sequential circuit set includes a sequential circuit having a configuration corresponding to at least one circuit included in the at least one die.

20 Claims, 12 Drawing Sheets

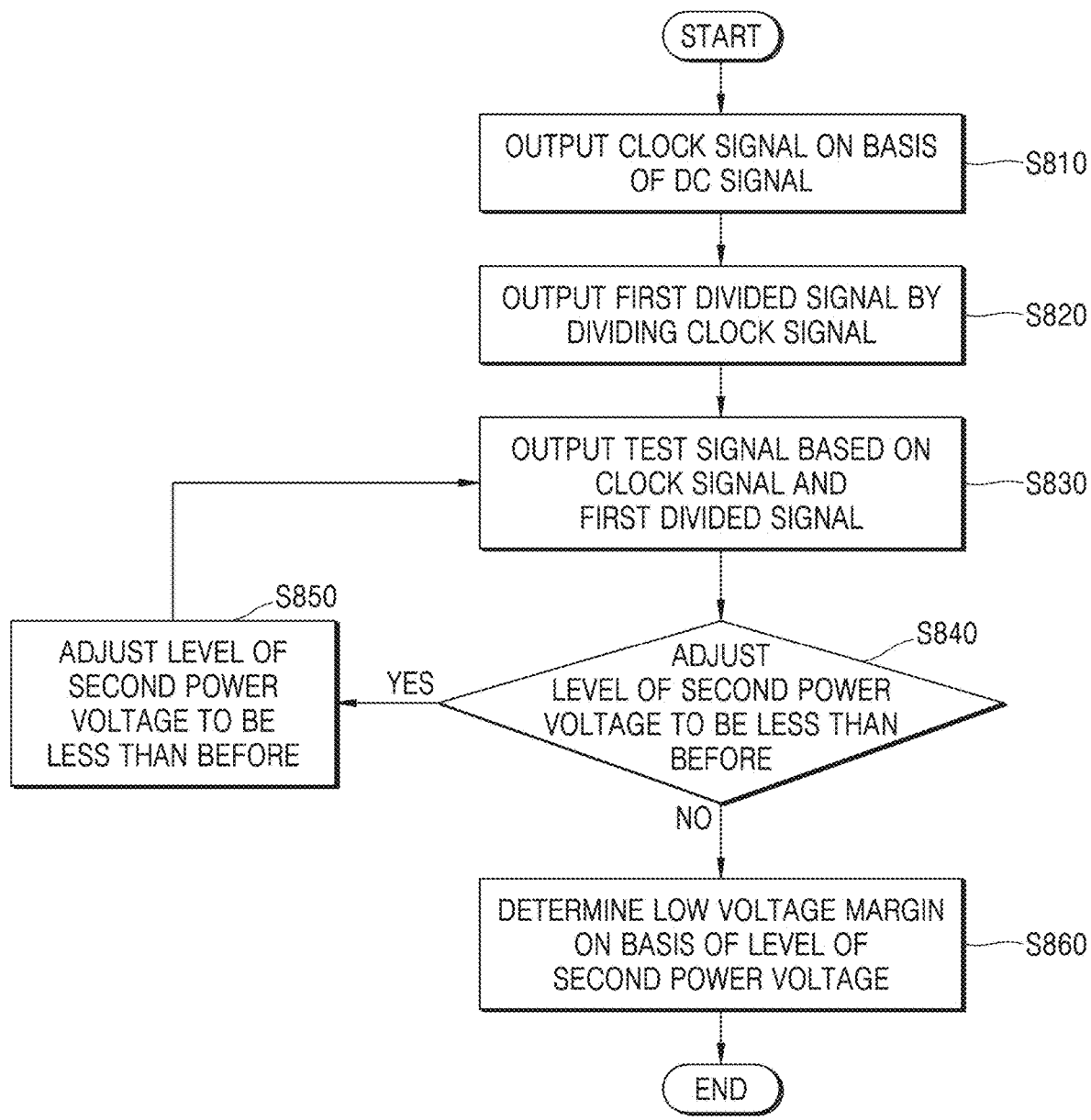

TEST ELEMENT GROUP AND TEST METHOD

CROSS-REFERENCE TO RELATED APPLICATION

This application is based on and claims priority under 35 U.S.C. § 119 to Korean Patent Application No. 10-2021-0068607, filed on May 27, 2021, in the Korean Intellectual Property Office, the disclosure of which is incorporated by reference herein in its entirety.

BACKGROUND

Inventive concepts relate to a test element group (TEG) and/or a test method, and more particularly, to a TEG disposed adjacent to at least one die/chip such as at least one memory chip on a wafer and/or a test method.

According to miniaturization of semiconductor processes, the sizes of manufactured circuits have been decreased. Thus, as the sizes of the circuits decrease, the operating voltages of the circuits may also decrease. Accordingly, a degree and/or an impact of variation in the circuit characteristics according to a process, voltage, and temperature (PVT) changes have increased. Consequently, when designing a product, it may be more important to determine whether logic circuits operate normally, and the necessity of or desirability of measuring the electrical characteristics of logic circuits for determining whether logic circuits operate normally is increasing.

SUMMARY

Inventive concepts provide scribe structures/a test element group (TEG) and/or a test method of measuring the electrical characteristics of a sequential circuit on a wafer even with respect to a direct current (DC) signal.

According some example embodiments, there is provided a test element group (TEG) adjacent to a semiconductor die, the TEG including a ring oscillator configured to output a clock signal based on a direct current (DC) signal received through a first pad and from a test device, a first divider configured to divide the clock signal and to output a first divided signal, and a sequential circuit set configured to receive the clock signal and the first divided signal, to generate a test signal based on the clock signal and the first divided signal, and to output the test signal to the test device through a second pad. The sequential circuit set includes a sequential circuit having a configuration corresponding to at least one circuit included in the at least one die.

According to some example embodiments, there is provided a method of testing a test element group (TEG) including outputting a clock signal based on a direct current (DC) signal received from a test device, the outputting the clock signal using a ring oscillator driven at a first power voltage, outputting a first divided signal by dividing the clock signal, the outputting the first divided signal using a first divider driven at the first power voltage, outputting a test signal based on the clock signal and the first divided signal, the outputting the test signal using a sequential circuit set driven at a second power voltage different from the first power voltage, and determining, using the test device, a low voltage margin of a sequential circuit in the sequential circuit set based on the test signal.

According to some example embodiments, there is provided a test element group (TEG) including a ring oscillator configured to receive a first power voltage and configured to output a clock signal in response to a direct current (DC) signal received from a test device, a first divider configured to receive the first power voltage and configured to divide the clock signal to output a first divided signal, and a sequential circuit set configured to receive a second power voltage and configured to output a value of the first divided signal to the test device as a test signal at an edge timing of the clock signal. The sequential circuit set is configured to receive a level of the second power voltage that is gradually reduced by the test device.

BRIEF DESCRIPTION OF THE DRAWINGS

Some example embodiments will be more clearly understood from the following detailed description taken in conjunction with the accompanying drawings in which:

FIG. 8 is a flowchart illustrating an algorithm of a test method according to various example embodiments of inventive concepts.

DETAILED DESCRIPTION OF EXAMPLE EMBODIMENTS

Hereinafter, various example embodiments of inventive concepts will be described in detail with reference to the accompanying drawings.

Figure 1:
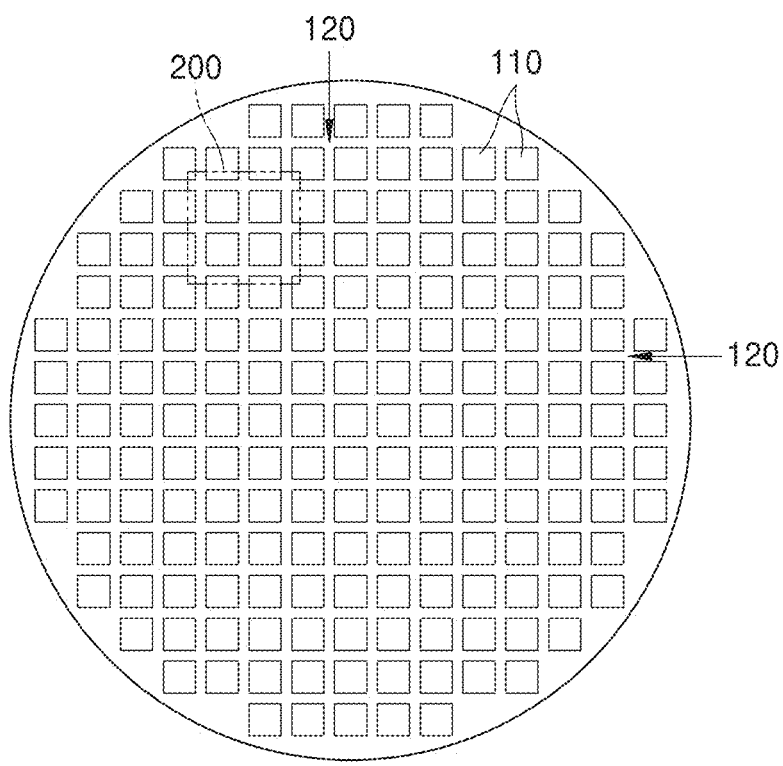
FIG. 1 is a diagram illustrating an example of a semiconductor wafer.

FIG. 1 is a diagram illustrating an example of a wafer 100.

Referring to FIG. 1, the wafer 100 may include a plurality of chip regions 110 and a plurality of scribe-lanes 120. The wafer 100 may be or may include a semiconductor material, and may be silicon wafer, a group III_V wafer, a silicon-on-insulator (SOI) wafer, a silicon-on-sapphire (SOS) wafer, and/or another material wafer. A diameter of the wafer 100 may be 200 mm, or 300 mm, or 450 mm; however, example embodiments are not limited thereto. The wafer 100 may include or define a notch (not illustrated) and/or a flat (not illustrated).

A variety of circuit devices may be mounted in the plurality of chip regions 110. For example, a resistor, an inductor, a capacitor, a diode, a transistor, etc. may be mounted in the plurality of chip regions 110. The chip regions 110 may be rectangular, e.g. may be square; however, example embodiments are not limited thereto. The chip regions 110 may 100 may extend to various edges of the wafer 100, and partial chip regions may be defined; however, example embodiments are not limited thereto. A number of chip regions 110 may be more than, the same as, or less than that illustrated in FIG. 1.

The scribe-lane 120 may be defined as a region between the chip region 110 on the wafer 100 and another chip region 110. The scribe-lane 120 may be or correspond to a region cut to separate the plurality of chip regions 110 after processing of the wafer 100 is finished. The scribe-lane 120 may be referred to as a kerf region; however, example embodiments are not limited thereto. A width of the scribe region 120 in one direction may be the same as, or different from, a width of the scribe region 120 in another direction perpendicular to the one direction. Alternatively or additionally, a first scribe region 120 may have a first width, and a second scribe 120 parallel to the second scribe region 120 may have a second width, greater than or less than the first width.

Figure 2:
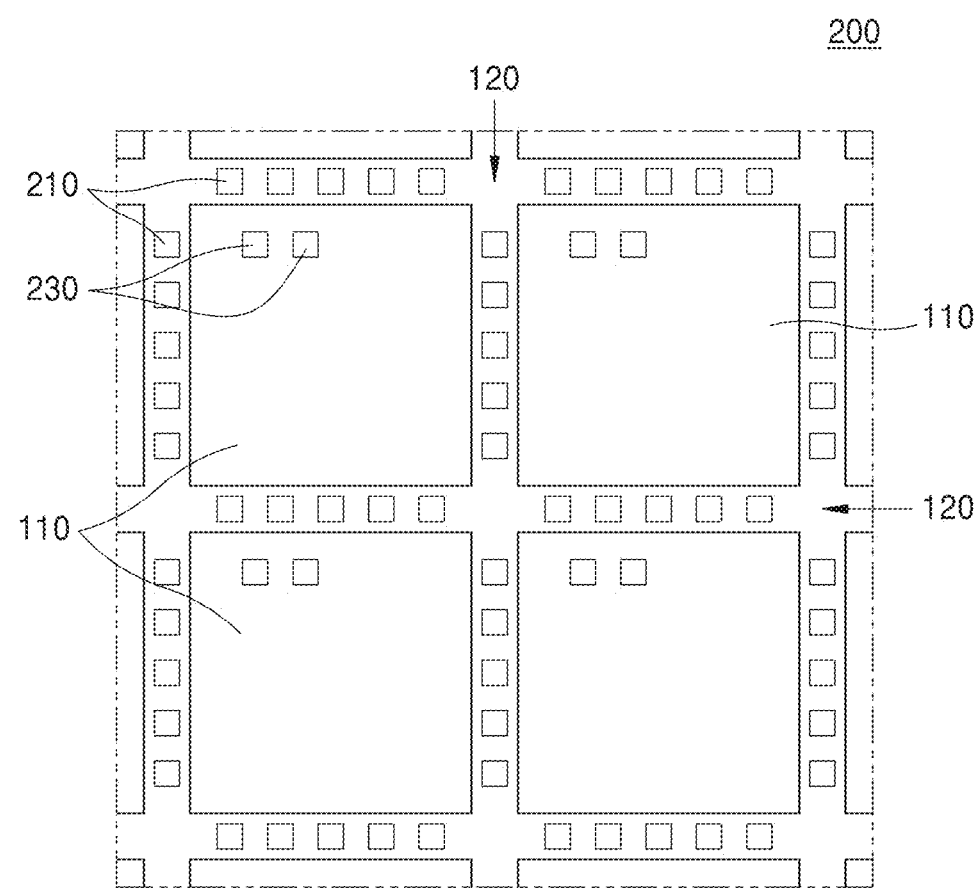
FIG. 2 is a partially enlarged view of a part of FIG. 1.

FIG. 2 is a partially enlarged view of a part 200 of FIG. 1.

Referring to FIGS. 1 and 2, FIG. 2 is an enlarged view of the part 200 of FIG. 1, and includes the plurality of chip regions 110 and the plurality of scribe-lanes 120.

A sequential circuit 230 and/or a peripheral circuit and/or a combinatorial logic circuit and/or a memory circuit may be mounted in the plurality of chip regions 110. The sequential circuit 230 and/or the memory circuit may be or may include a circuit requiring or using a clock. For example, the sequential circuit 230 and/or the memory circuit is a logic circuit whose output is determined by a current state and a current input value, and may be or may include a circuit including a flip-flop such as at least one of an SR flip-flop, a D flip-flop, a JK flip-flop, a T flip-flop, etc.

A test may be required or used to determine operating characteristics and/or electrical characteristics of a semiconductor chip formed within the chip region 110. The operating characteristics or electrical characteristics of the chip may be characteristics indicating at least one of a low voltage margin that is a voltage required or used for a normal operation of an evaluation circuit, a timing margin of the evaluation circuit, and a value of delay occurred by the evaluation circuit, etc. The evaluation circuit may be a circuit including the sequential circuit 230 and/or the memory circuit.

Methods of testing the semiconductor chip include methods of testing an actual device-under-test (DUT)/device on silicon (Si), methods of testing the semiconductor chip using a simulation instead of or in addition to an actual device on silicon, etc.

Methods of testing the semiconductor chip with respect to an actual device on silicon include a method of forming a test die having the evaluation circuit mounted on at least one of the plurality of chip regions 110, and measuring an on-chip delay, a timing margin, etc. using the test die.

Alternatively or additionally, other methods of testing the semiconductor chip with respect to an actual device on silicon include mounting the evaluation circuit on the scribe-lanes 120 as a configuration of a test element group (TEG) 210, and measuring electrical characteristics of the evaluation circuit, etc. The TEG 210 may be or may include a pattern implemented to measure actual characteristics of a semiconductor chip. When the TEG 210 is mounted on the scribe-lanes 120, the TEG 210 may be disposed adjacent to or in a scribe lane 120 adjacent to at least one memory chip on the wafer 100. There may be other structures within the scribe lane 120; for example, there may be structures associated with measuring thicknesses of various films and/or electrical properties of various components such as but not limited to transistor properties, metal resistances/capacitances, via and/or contact resistances/capacitances, defect monitors, etc.; however, example embodiments are not limited thereto.

When the evaluation circuit is tested by mounting the TEG 210 on the scribe-lanes 120, unlike testing the evaluation circuit through simulation, actual measurement may be performed using a circuit mounted on silicon, and thus the electrical characteristics of the actual circuit may be measured and/or assessed more accurately.

Alternatively or additionally, when the TEG 210 is mounted on the scribe-lanes 120 to test the evaluation circuit, a separate test die is not required, and thus it is efficient to mass-produce the chip.

In order to test the evaluation circuit mounted on the wafer 100, a test device may be required/used separately from the wafer 100. For example, in order to test the evaluation circuit mounted on the wafer 100, a voltage or current signal may be input from the test device to the evaluation circuit, and a signal output through the evaluation circuit may be input again to or into the test device. The electrical characteristic of the evaluation circuit may be measured based on the signal input to the test device.

When the evaluation circuit is tested by mounting the TEG 210 on the scribe-lanes 120, the test device tests the evaluation circuit using, for example, a direct current (DC) signal. For example, the test device may input the DC signal to the evaluation circuit and measure the electrical characteristics of the evaluation circuit based on an output of the evaluation circuit. At this time, the evaluation circuit may be the sequential circuit 230. In order to test the sequential circuit 230, a clock signal for testing the sequential circuit 230 is or may be required. Therefore, it may be difficult to test the sequential circuit 230 mounted on the TEG 210 using the test device that uses the DC signal instead of a pulse signal, and in order to test the sequential circuit 230, an additional circuit may be required.

Figure 3:
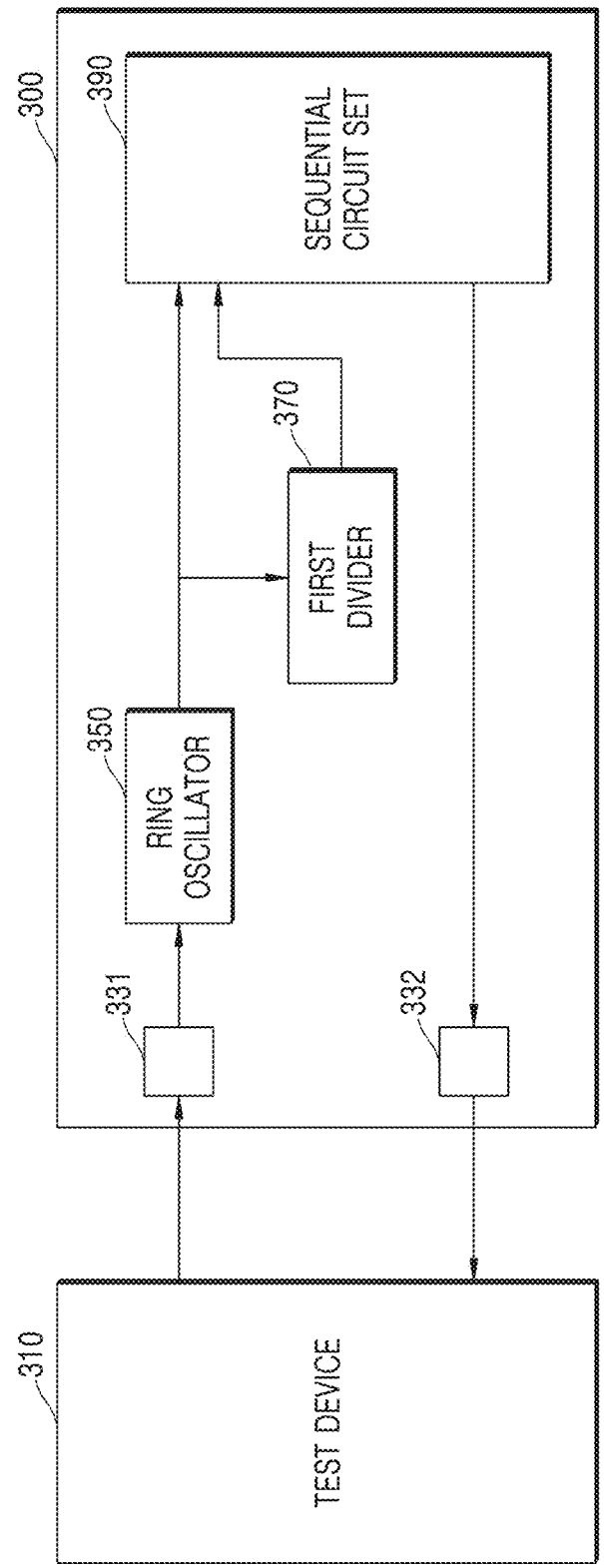
FIG. 3 is a block diagram illustrating a test element group (TEG) according to various example embodiments of inventive concepts.

FIG. 3 is a block diagram illustrating a TEG 300 along with a test device 310 according to various example embodiments of inventive concepts.

Referring to FIG. 3, the TEG 300 according to various example embodiments of inventive concepts may include a first pad 331, a second pad 332, a ring oscillator 350, a second divider 370, and a sequential circuit set 390.

The TEG 300 may transmit and/or receive various signals to and/or from a test device 310. For example, the TEG 300 may receive a DC signal from the test device 310. Also, the TEG 300 may receive the DC signal from the test device through the first pad 331. The DC signal may be or correspond to a signal for testing an evaluation circuit mounted on a scribe-lane. The TEG 300 may output a test signal to the test device 310. Also, the TEG 300 may output the test signal to the test device 310 through the second pad 332. A more detailed description related to the test signal will be described later.

The ring oscillator 350 is or includes or corresponds to a device capable of generating a pulse signal, e.g. a discrete pulse signal, by receiving the DC signal. As described above, a clock signal is required to test a sequential circuit. However, the test device 310 for testing the evaluation circuit mounted on the scribe-lane performs the test using the DC signal. Accordingly, the sequential circuit mounted on the scribe-lane may be tested by generating the pulse signal using the ring oscillator 350. The ring oscillator 350 may be configured to output a signal such as a clock signal based on the DC signal received from the test device 310 through the first pad 331.

The clock signal output from the ring oscillator 350 may be input to the first divider 370 and the sequential circuit set 390. The sequential circuit set 390 is a circuit including a sequential circuit, and a detailed description thereof will be described later.

The first divider 370 is or includes a circuit dividing a frequency, and may receive the clock signal and divide the clock signal. Specifically, the first divider 370 may be configured to output a first divided signal by dividing the clock signal.

The first divider 370 may generate the first divided signal based on the clock signal output from the ring oscillator 350, thereby reducing a timing error between the clock signal and the first divided signal input to the sequential circuit set 390.

The first divided signal is or corresponds to a signal for measuring electrical characteristics of the sequential circuit set 390, and may be output from the first divider 370 to the sequential circuit set 390. The first divided signal may be a signal having a long period compared to the clock signal in order to secure a stable set-up margin and a hold margin.

The sequential circuit set 390 may receive the clock signal and the first divided signal. The received clock signal and first divided signal may be output as a test signal through the sequential circuit set 390. For example, the sequential circuit set 390 may be configured to output the test signal to the test device 310 through the second pad 332 by receiving the clock signal and the first divided signal, and generating the test signal based on the clock signal and the first divided signal.

The sequential circuit set 390 includes a sequential circuit, and the sequential circuit may be a circuit to be tested/a circuit-under-test (CUT). The sequential circuit included in the sequential circuit set 390 is a circuit included in the TEG 300 mounted on the scribe-lane, and may not be a circuit included in a memory chip, e.g. memory chip 110, to be mass-produced. Accordingly, the sequential circuit set 390 may include a sequential circuit having a configuration corresponding to at least one memory circuit included in at least one memory chip on a wafer. Accordingly, there is no need or desire or requirement or expectation to mount the evaluation circuit on the memory chip to be mass-produced, and a size of the memory chip and/or the mass productivity of the chip may be increased. Alternatively or additionally, a test is performed on the sequential circuit mounted on the wafer, thereby evaluate silicon-based actual measurement rather than simulation.

Figure 4:
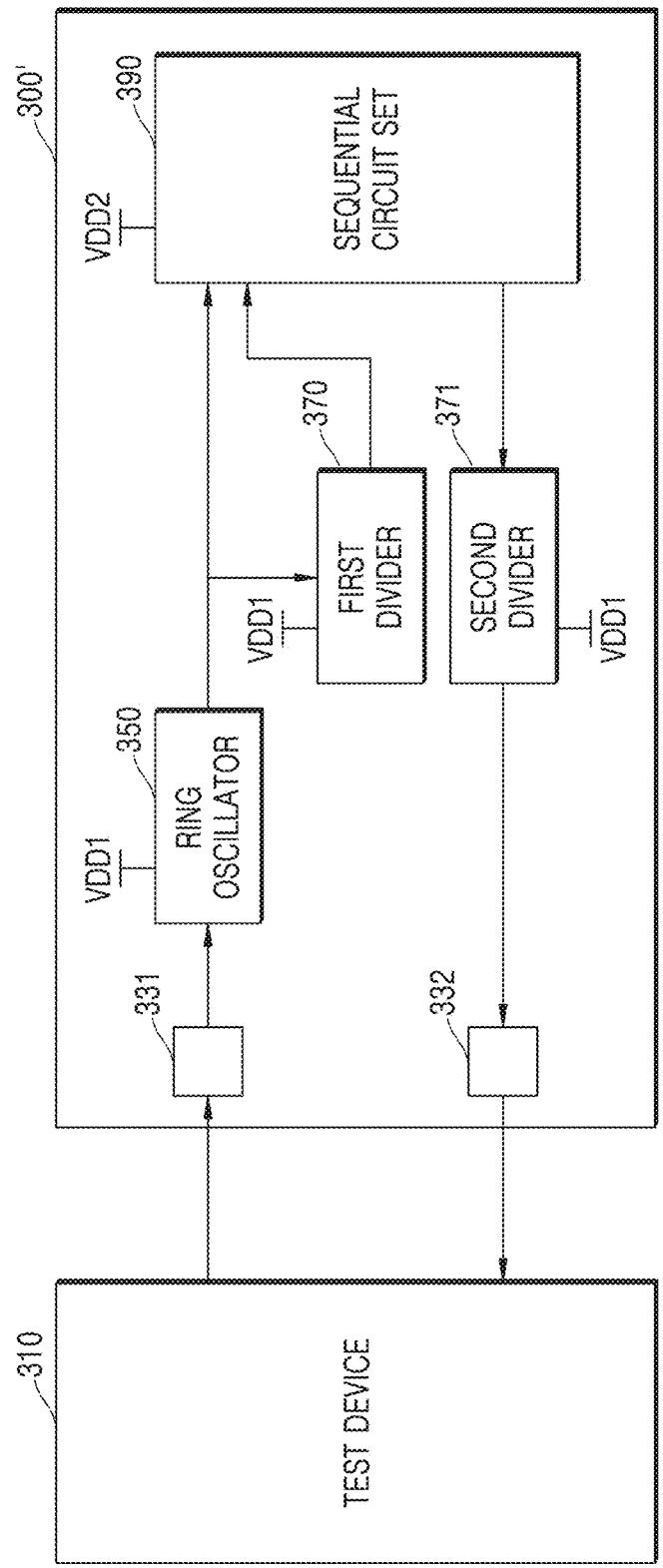
FIG. 4 is a block diagram illustrating a TEG according to various example embodiments of inventive concepts.

FIG. 4 is a block diagram illustrating a TEG 300' according to various example embodiments of inventive concepts.

Referring to FIG. 4, the TEG 300' according to various example embodiments of inventive concepts may include the first pad 331, the second pad 332, the ring oscillator 350, the first divider 370, the second divider 371 and the sequential circuit set 390.

The test device 310, the first pad 331, the second pad 332, the ring oscillator 350, the first divider 370, and the sequential circuit set 390 shown in FIG. 4 may respectively correspond to the test device 310, the first pad 331, the second pad 332, the ring oscillator 350, the first divider 370, and the sequential circuit set 390 shown in FIG. 3, and perform the same or similar functions.

The second divider 371 is a circuit dividing a frequency, and may receive a test signal that is an output signal of the sequential circuit set 390 and may divide the test signal. Specifically, the second divider 371 may be configured to divide the test signal received from the sequential circuit set 390 and output the test signal to a test device through the second pad 332 as a second divided signal.

A divider may divide a frequency of an input signal to output a signal whose frequency is divided by $$\frac{1}{n}$$

times. In this case, n may be referred to as a division ratio. A division ratio of the second divider 371 may vary according to the performance of the test device 310. For example, the division ratio of the second divider 371 may be determined according to a signal detecting resolution of the test device 310.

For example, a frequency of the test signal output from the sequential circuit set 390 may be about 1.75 GHz. However, the test device 310 may require or expect that a signal having a frequency of about 1 MHz be input to analyze a certain signal. In this case, the second divider 371 may be configured to have a division ratio of about 1750, and may divide the test signal at the above division ratio so that the test device 310 may accurately analyze the signal.

The division ratio of the first divider 370 and the division ratio of the second divider 371 may be different. The division ratio of the first divider 370 may be determined based on a set-up margin and/or a hold margin, and the second divider 371 may be determined based on the performance of the test device 310.

Each of the ring oscillator 350, the first divider 370, and the second divider 3710 may be driven at a first power voltage VDD1, and the sequential circuit set 390 may be driven at a second power voltage VDD2 which may be the same as, less than, or greater than the first power voltage VDD1.

The second power voltage VDD2 is a power voltage independent from the first power voltage VDD1, and may be a power voltage for measuring a low voltage margin of a sequential circuit. Alternatively or additionally, a level of the second power voltage VDD2 may be gradually decreased, e.g. linearly and/or stepwise decreased, by the test device 310. For example, in order to measure the low voltage margin of the evaluation circuit, the level of the power voltage applied to the evaluation circuit needs to or is expected to be reduced. However, when a power voltage level applied to each of the ring oscillator 350 and the first divider 370 of the TEG 300' is reduced together with a power voltage level applied to the sequential circuit set 390, each of a clock signal that is an output signal of the ring oscillator 350 and a first divided signal that is an output signal of the first divider 370 may have a long period. Alternatively, when a power voltage applied to the sequential circuit set 390 and a power voltage applied to each of the ring oscillator 350 and the first divider 370 are independent, only the power voltage level applied to the sequential circuit set 390 may be reduced. In this case, the clock signal and the first divided signal may be input to the sequential circuit set 390 in a state in which each of the clock signal and the first divided signal does not have a long period. Accordingly, evaluation on the sequential circuit may be accelerated.

Figure 5A:
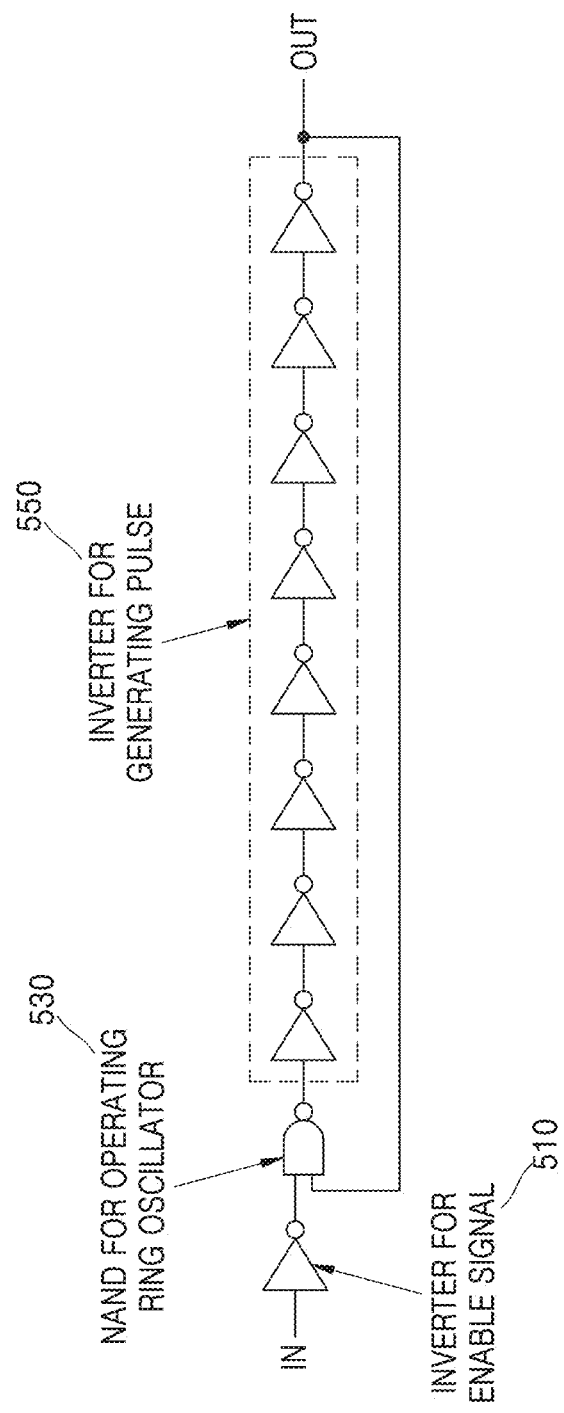
FIGS. 5A to 5C are diagrams illustrating components of a TEG according to various example embodiments of inventive concepts.
Figure 5B:
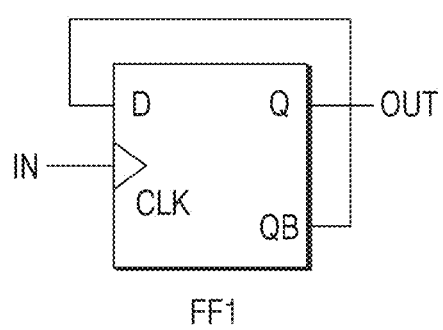
Figure 5C:
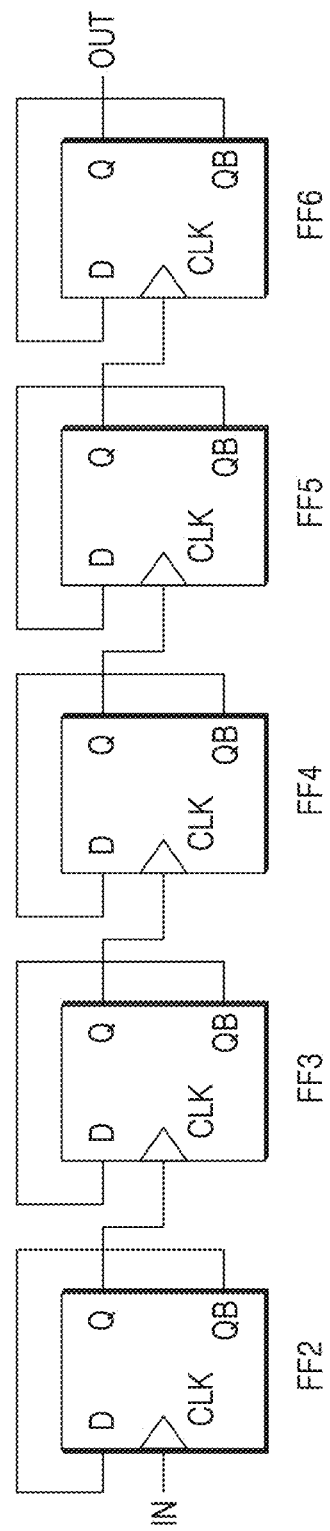

FIGS. 5A to 5C are diagrams illustrating components of a TEG according to various example embodiments of inventive concepts.

FIG. 5A is a diagram illustrating a ring oscillator according to various example embodiments of inventive concepts.

Referring to FIG. 5A, the ring oscillator according to various example embodiments of inventive concepts may include an inverter 510 that generates an enable signal of the ring oscillator according to an input signal.

In addition, the ring oscillator may include a NAND device 530 that receives the enable signal to operate the ring oscillator, and at least one inverter 550 that generates a pulse signal.

The number of stages of the inverter 550 for generating the pulse signal may be determined as the number of stages capable of generating a pulse signal suitable for measuring a low voltage margin of a sequential circuit. In addition, the total number of the NAND device 530 operating the ring oscillator and the inverter 550 for generating the pulse signal may be $2^m-1$ (m is a natural number). For example, the total number of inverters may be odd. When the number of inverters is odd, and a last one of the inverters is fed back to a first NAND gate, an oscillation may be created. A frequency or period of the oscillation may be based on electrical properties of transistors, such as NMOS transistors and/or PMOS transistors, included in the NAND gates and/or the inverters. For example, the NMOS transistors and/or the PMOS transistors included in the inverter 550 may have the same or similar electrical performance as those of NMOS transistors and/or PMOS transistors included in the memory chip 110, for example in circuits that use various flip-flops.

Although not shown in the drawings, the ring oscillator may include a NAND device and/or a NOR device as a switch for signal oscillation.

Alternatively or additionally, the ring oscillator may further include a power-cap removing the influence of power noise so as to generate a stable clock signal.

Alternatively or additionally, the ring oscillator may further include at least one buffer for a stable input of a DC signal or a stable output of a clock signal.

FIGS. 5B and 5C are diagrams illustrating dividers according to various example embodiments of inventive concepts.

Referring to FIGS. 5B and 5C, a divider according to various example embodiments of inventive concepts may be configured as a flip-flop, but is not limited thereto.

As shown in FIG. 5B, the divider according to some example embodiments of inventive concepts may include one flip-flop FF 1, but is not limited thereto.

Also, as shown in FIG. 5C, the divider according to various example embodiments of inventive concepts may be configured as a plurality of stages, for example, a plurality of flip-flops FF 2 to FF 6. As the number of stages of the divider increases, the division ratio of the divider may also increase. For example, a first divider according to various example embodiments of inventive concepts may be configured as one stage based on a set-up margin and the hold margin with a clock signal. In addition, a second divider according to various example embodiments of inventive concepts may be configured as 10 stages based on a signal detecting resolution of a test device so that the second divider may have a division ratio greater than that of the first divider. However, the number of stages of the first divider and the second divider is not limited to the above description.

Although not shown in the drawings, at least one buffer may be connected before and after the first divider or the second divider according to various example embodiments of inventive concepts. The at least one buffer may be connected so that a stable signal may be input to the first divider or the second divider, and an output of the first divide or the second divider may be stably transmitted to another device.

Figure 6:
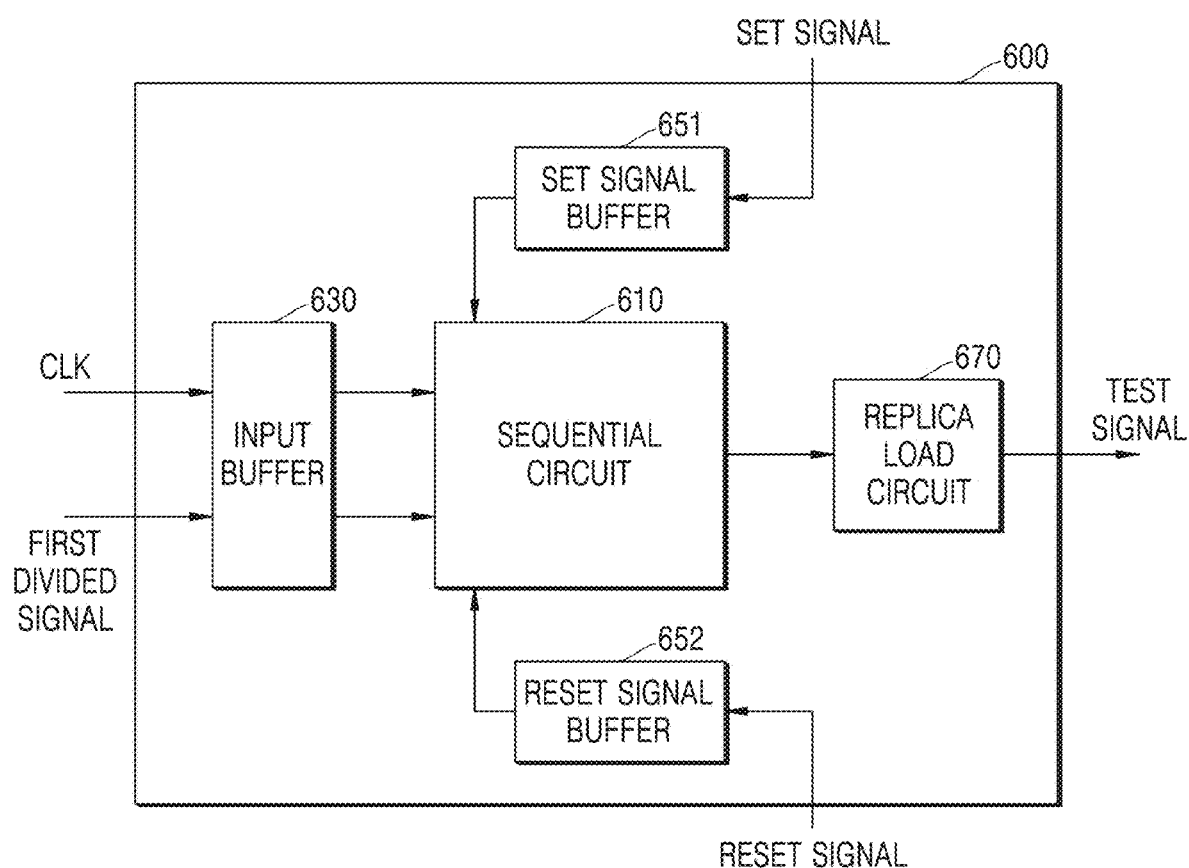
FIG. 6 is a block diagram illustrating a sequential circuit set according to various example embodiments of inventive concepts.

FIG. 6 is a block diagram illustrating a sequential circuit set 600 according to various example embodiments of inventive concepts.

Referring to FIG. 6, the sequential circuit set 600 may include a sequential circuit 610, an input buffer 630, a set signal buffer 651, a reset signal buffer 652 and/or a replica load circuit 670. A clock signal, a first divided signal, a set signal, and/or a reset signal may be input to the sequential circuit set 600, and a signal output from the sequential circuit set 600 may be referred to as a test signal.

As described above, as the size of a circuit is reduced and an operating voltage of the circuit is reduced, it is important or desirable to measure the electrical characteristics of the circuit. A voltage level applied to an actual semiconductor chip may be reduced depending on circumstances. Therefore, it is important or desirable to measure a low voltage margin required for a normal operation of the circuit among the electrical characteristics of the circuit.

In order to measure the low voltage margin of an evaluation circuit, a situation in which the voltage level applied to the actual semiconductor chip is lower than the existing voltage level may be implemented in the evaluation circuit. For example, a situation in which a low voltage is applied to the semiconductor chip may be simulated by reducing the power voltage level applied to the evaluation circuit and reducing the amplitude of signals input to the evaluation circuit.

The input buffer 630 may be connected to a front end of the sequential circuit 610. Accordingly, the clock signal and the first divided signal may be input to the sequential circuit 610 through the input buffer 630. The input buffer 630 may reduce amplitudes of the input clock signal and first divided signal. For example, the input buffer 630 may be configured to reduce the amplitudes of the clock signal and the first divided signal and output the clock signal and the first divided signal to the sequential circuit 610. The amplitudes of the clock signal and the first divided signal input to the sequential circuit 610 that is the evaluation circuit are reduced, and thus a situation in which a low voltage is applied to the semiconductor chip may be simulated in/within the sequential circuit 610.

The set signal buffer 651 and the reset signal buffer 652 may be connected to the sequential circuit 610. The set signal buffer 651 may be configured to reduce the amplitude of the set signal input to the sequential circuit 610. Also, the reset signal buffer 652 may be configured to reduce the amplitude of the reset signal input to the sequential circuit 610. The amplitudes of the set signal and the reset signal input to the sequential circuit 610 may be reduced, and thus a situation in which a low voltage is applied to the semiconductor chip may be simulated in the sequential circuit 610.

The sequential circuit 610 mounted on the actual memory chip is not used alone, but may be used in connection with several load circuits. The replica load circuit 670 may have a configuration corresponding to at least one load circuit included in at least one memory chip formed in a chip region of a wafer. The sequential circuit set 600 includes the replica load circuit 670, and thus the state of the sequential circuit 610 used in connection with the load circuit in the actual memory chip may be simulated to the sequential circuit 610 included in a TEG.

Situations of the sequential circuit 610 used in the actual chip are simulated to the sequential circuit 610 included in the TEG, and thus the low voltage margin of the sequential circuit 610 may be measured more accurately.

Although not shown in FIG. 6, the TEG according to various example embodiments of inventive concepts may include a buffer configured to adjust timing of the clock signal and the first divided signal at the front end of the sequential circuit set 600. Also, the TEG may include a buffer at a rear end of the sequential circuit set 600 so that a test signal may be stably input from the sequential circuit set 600 to a second divider.

Figure 7:
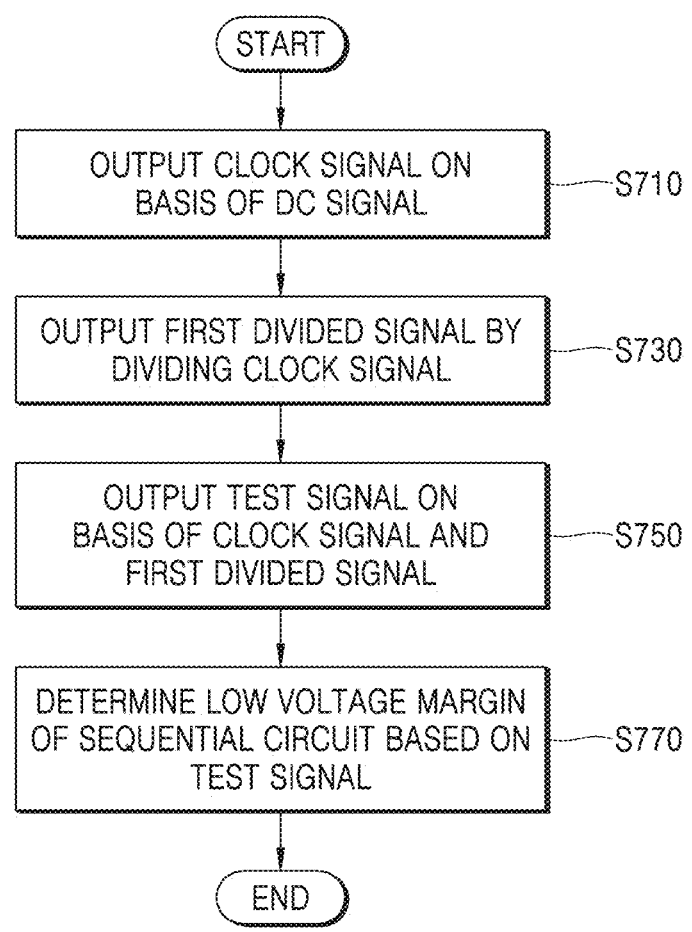
FIG. 7 is a flowchart illustrating a test method according to various example embodiments of inventive concepts.

FIG. 7 is a flowchart illustrating a test method according to various example embodiments of inventive concepts.

Referring to FIG. 7, the test method according to various example embodiments of inventive concepts may include a plurality of operations S710, S730, S750, and S770. Each of, or some of, the plurality of operations may be performed on each TEG, or a subset of TEGs within one wafer. Furthermore, each of, or some of, the plurality of operations may be performed before a wafer has been fully fabricated, and/or after a wafer has been fully fabricated.

In operation S710, a clock signal may be output based on a DC signal. For example, the clock signal may be output based on the DC signal received from a test device using a ring oscillator driven at a first power voltage. The ring oscillator may generate a clock signal with a period and/or a duty cycle and/or a skew based on electrical performance of inverters included in the ring oscilaotr.

A first divided signal may be output by dividing the clock signal in operation S730. For example, the first divided signal may be output by dividing the clock signal using a first divider driven at the first power voltage.

In operation S750, a test signal may be output based on the clock signal and the first divided signal. For example, the test signal based on the clock signal and the first divided signal may be output using a sequential circuit set driven at a second power voltage different from the first power voltage; the sequential circuit set may operate, e.g. sequentially operate, based on the clock signal generated by the ring oscillator.

In operation S770, a low voltage margin of the sequential circuit may be determined based on the test signal. For example, using the test device, the low voltage margin of the sequential circuit in the sequential circuit set may be determined based on the test signal.

Also, the test method according to various example embodiments of inventive concepts may include outputting a second divided signal by dividing the test signal using a second divider driven at the first power voltage.

Also, the test method according to various example embodiments of inventive concepts may include determining a low voltage margin based on the second divided signal.

FIG. 8 is a flowchart illustrating an algorithm of a test method according to various example embodiments of inventive concepts.

Referring to FIG. 8, a clock signal may be output based on a DC signal in operation S810.

A first divided signal may be output by dividing the clock signal in operation S820.

In operation S830, a test signal may be output based on the clock signal and the first divided signal.

Operations S810, S820, and S830 may correspond to operations S710, S730, and S750, respectively, and the same operations may be performed.

In operation S840, a level transition of the test signal may be detected during a certain time interval. For example, operation characteristics of the TEG according to the embodiment of the inventive concept may be measured by a test device, and whether a level of the test signal output from a TEG transitions during a certain time interval may be detected.

In addition, when the TEG according to various example embodiments of inventive concepts includes a second divider, whether a level of a second divided signal transitions during a certain time interval may be detected. The second divided signal may have a frequency based on the performance of the test device. Accordingly, when the TEG is tested based on the second divided signal, the operation characteristics of the TEG may be effectively measured.

In operation S850, a level of a second power voltage may be adjusted to be lower than before. Specifically, when the level transition of the test signal is detected, the level of the second power voltage may be adjusted to be less than before. For example, when the level transition of the test signal of a sequential circuit set to which the second power voltage is applied is detected during a certain time interval by the test device, it may be determined that a sequential circuit applied at the corresponding second power voltage operates normally. The sequential circuit operates normally, and thus the corresponding second power voltage may not be regarded as a low voltage margin, and the sequential circuit may be tested by applying a lower power voltage thereto. Therefore, the level of the second power voltage may be adjusted to be less than before.

In operation S860, the low voltage margin may be determined based on the level of the second power voltage. Specifically, when the level transition of the test signal is not detected, the low voltage margin may be determined based on the level of the second power voltage. For example, when the level transition of the test signal of the sequential circuit set to which the second power voltage is applied is not detected by the test device during a certain time interval, the sequential circuit applied at the second power voltage does not operate normally. For example, when the power voltage level applied to the sequential circuit is reduced, an operation current of the sequential circuit is weakened, and a swing speed of the test signal output through the sequential circuit is slowed. Accordingly, the test signal may not fully swing within a period of the clock signal applied to the sequential circuit. As a result, the level transition of the test signal is not detected below a certain low voltage, and a power voltage at a time when the level transition of the test signal is not detected may be evaluated as the low voltage margin of the sequential circuit.

When the TEG according to various example embodiments of inventive concepts includes the second divider, the low voltage margin may be measured based on the second divided signal.

For example, when the level transition of the second divided signal is detected during a certain time interval, the level of the second power voltage applied to the sequential circuit may be adjusted to be less than before. Also, when the level transition of the second divided signal is not detected during a certain time interval, the low voltage margin may be determined based on the level of the second power voltage applied to the sequential circuit.

The test method according to various example embodiments of inventive concepts may include reducing the amplitude of each of the clock signal and the first divided signal. Also, the test method may output the test signal based on the clock signal with reduced amplitude and the first fractional signal with reduced amplitude using the sequential circuit set. The test method according to various example embodiments of inventive concepts may include reducing the amplitude of each of the clock signal and the first divided signal, thereby simulating a situation in which a low voltage is applied in an actual chip in the sequential circuit included in the TEG.

The test method according to various example embodiments of inventive concepts may include dividing the test signal at a second division ratio to match the performance of the test device. The second division ratio may be different from a first division ratio of the first divider. For example, the second division ratio may be greater than the first division ratio.

Figure 9A:
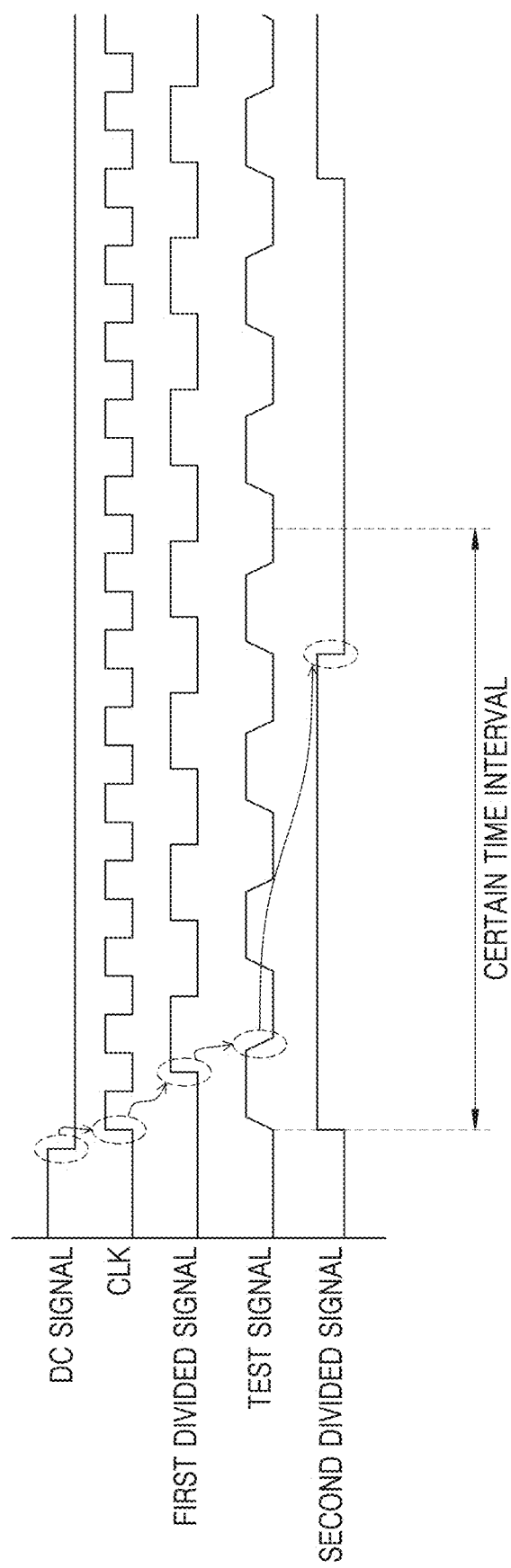
FIGS. 9A and 9B are timing diagrams of TEG signals according to various example embodiments of inventive concepts.
Figure 9B:
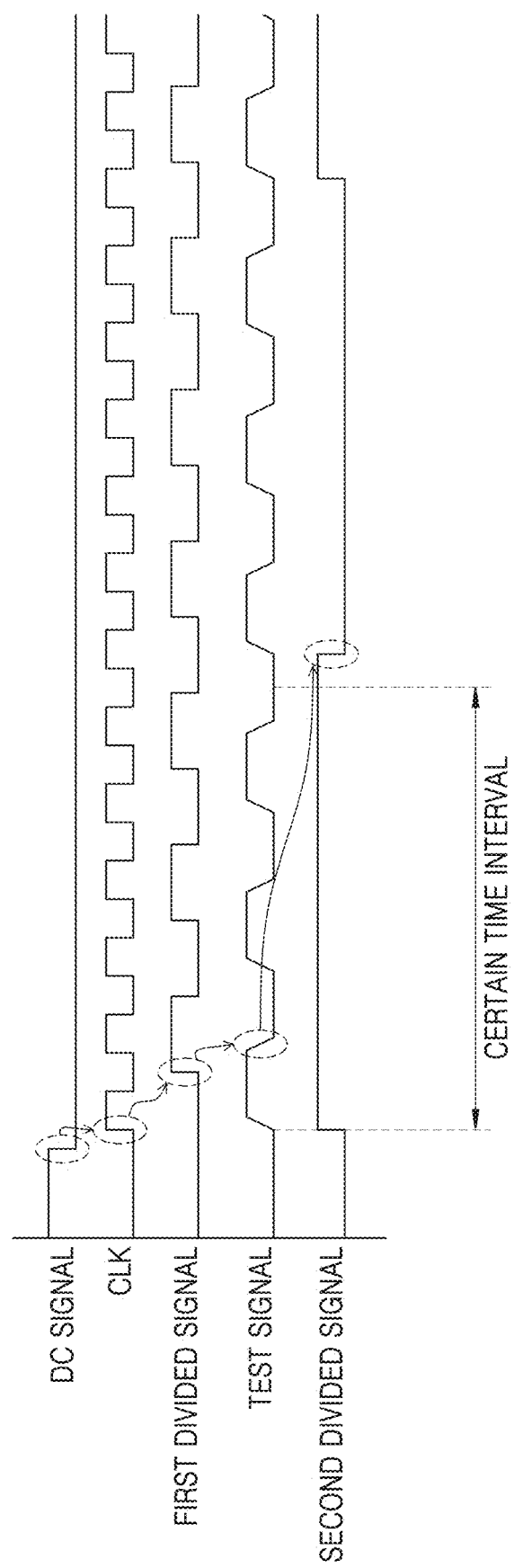

FIGS. 9A and 9B are timing diagrams of TEG signals according to various example embodiments of inventive concepts.

Referring to FIGS. 9A and 9B, a DC signal may be input from a test device to a ring oscillator.

The ring oscillator may be applied with a first power voltage and configured to output a clock signal CLK in response to the DC signal received from the test device.

The first divider may be applied with the first power voltage and configured to output a first divided signal by dividing the clock signal CLK. Accordingly, FIGS. 9A and 9B are timing diagrams of the first divided signal having a longer period than that of the clock signal by dividing a frequency of the clock signal CLK.

A sequential circuit set may be applied with a second power voltage and configured to output a value of the first divided signal as a test signal to the test device at an edge timing of the clock signal CLK. FIGS. 9A and 9B are timing diagrams of an example of a test signal based on the clock signal CLK and the first divided signal.

A level of the second power voltage may be gradually reduced (e.g. linearly and/or step-wise reduced) by the test device. The sequential circuit set may include at least one sequential circuit corresponding to at least one memory circuit included in a semiconductor chip. In addition, the sequential circuit set may include a plurality of inverters configured to reduce the amplitude of at least one of the clock signal CLK, the first divided signal, and the test signal as the level of the second power voltage is reduced.

A second divider may be applied with the first power voltage and configured to output a second divided signal by dividing the test signal received from the sequential circuit set. The second divided signal may be a signal obtained by dividing the test signal at a second division ratio to match the performance of the test device. Additionally or alternatively, the second division ratio may be different from a first division ratio of the first divider. For example, the second division ratio may be greater than the first division ratio. FIGS. 9A and 9B are timing diagrams of the second divided signal having a longer period than that of the test signal by dividing the frequency of the test signal.

The level of the second divided signal may transition for a certain time interval. FIG. 9A is a timing diagram of the second divided signal whose level transitions during a certain time interval. As described above, as shown in FIG. 9A, when the level of the second divided signal transitions during a certain time interval, it may be determined that the sequential circuit, which is an evaluation circuit, operates normally at the second power voltage. Accordingly, the level of the second power voltage may be adjusted to be less than before.

Conversely, the level of the second divided signal may not transition during a certain time interval. FIG. 9B is a timing diagram of the second divided signal whose level does not transition during a certain time interval. As described above, when the level of the second divided signal does not transition during a certain time interval as shown in FIG. 9B, it may be determined that the sequential circuit, which is the evaluation circuit, does not operate normally at the second power voltage. Accordingly, a low voltage margin may be determined based on the second power voltage. For example, the second power voltage, or a function of the second power voltage, at a time when a level transition of the second divided signal is not detected may be determined as the low voltage margin of the sequential circuit.

Example embodiments are not limited to those described above; furthermore, example embodiments may not necessarily be mutually exclusive to one another. For example, some example embodiments may include features described with reference to one or more figures, and may also include features described with reference to one or more other figures. While inventive concepts have been particularly shown and described with reference to various example embodiments thereof, it will be understood that various changes in form and details may be made therein without departing from the spirit and scope of the following claims.

What is claimed is:

1. A test element group (TEG) adjacent to at least one die, the TEG comprising:
    a first pad;
    a ring oscillator configured to output a clock signal based on a direct current (DC) signal received through the first pad on the TEG, the DC signal received from a test device;
    a first divider configured to divide the clock signal and to output a first divided signal; and
    a sequential circuit set configured to receive the clock signal and the first divided signal, to generate a test signal based on the clock signal and the first divided signal, and to output the test signal to the test device through a second pad, and the sequential circuit set includes a sequential circuit having a structure that matches at least one circuit included in the at least one die.

2. The TEG of claim 1, further comprising:
    a second divider configured to divide the test signal received from the sequential circuit set and to output a second divided signal to the test device through the second pad.

3. The TEG of claim 2, wherein a division ratio of the second divider is based on a measure of an electrical performance of the test device.

4. The TEG of claim 3, wherein a division ratio of the first divider is different from the division ratio of the second divider.

5. The TEG of claim 2, wherein
    a first power voltage drives each of the ring oscillator, the first divider, and the second divider, and
    a second power voltage drives the sequential circuit set.

6. The TEG of claim 5, wherein the test device is configured to gradually reduce a level of the second power voltage.

7. The TEG of claim 1, wherein the sequential circuit set further comprises an input buffer configured to reduce amplitudes of the clock signal and the first divided signal and to output the clock signal and the first divided signal to the sequential circuit.

8. The TEG of claim 1, wherein the sequential circuit set further comprises a set signal buffer configured to reduce an amplitude of a set signal input to the sequential circuit;
    a reset signal buffer configured to reduce an amplitude of a reset signal input to the sequential circuit; and
    a replica load circuit having a configuration corresponding to at least one load circuit included in the at least one die, and configured to receive a signal output from the sequential circuit and output the test signal.

9. A test method comprising:
outputting a clock signal based on a direct current (DC) signal received from a test device, the outputting the clock signal using a ring oscillator driven at a first power voltage;
outputting a first divided signal by dividing the clock signal, the outputting the first divided signal using a first divider driven at the first power voltage;
outputting a test signal based on the clock signal and the first divided signal, the outputting the test signal using a sequential circuit set driven at a second power voltage different from the first power voltage; and
determining, using the test device, a low voltage margin of a sequential circuit in the sequential circuit set based on the test signal,
wherein the determining of the low voltage margin comprises detecting a level transition of the test signal within a certain time interval.

10. The test method of claim 9, further comprising:
dividing the test signal and outputting a second divided signal, using a second divider driven at the first power voltage,
wherein the determining of the low voltage margin includes,
determining the low voltage margin based on the second divided signal.

11. The test method of claim 10, wherein
the outputting of the second divided signal comprises dividing the test signal at a second division ratio to match an electrical performance of the test device, and
the second division ratio is different from a first division ratio of the first divider.

12. The test method of claim 9, wherein the determining of the low voltage margin comprises detecting a level transition of the test signal within a certain time interval.

13. The test method of claim 12, wherein the determining of the low voltage margin comprises adjusting a level of the second power voltage to be less than a level before the level transition of the test signal being detected.

14. The test method of claim 12, wherein the determining of the low voltage margin comprises determining the low voltage margin based on a level of the second power voltage being when the level transition of the test signal is not detected.

15. The test method of claim 9, further comprising:
reducing an amplitude of each of the clock signal and the first divided signal,
wherein the outputting of the test signal comprises
outputting the test signal based on the clock signal with the reduced amplitude and on the first divided signal with the reduced amplitude.

16. A test element group (TEG) mounted with a semiconductor die to test the semiconductor die, the TEG comprising:
a ring oscillator configured to receive a first power voltage and configured to output a clock signal in response to a direct current (DC) signal received from a test device;
a first divider configured to receive the first power voltage and configured to divide the clock signal to output a first divided signal; and
a sequential circuit set configured to receive a second power voltage and configured to output a value of the first divided signal to the test device as a test signal at an edge timing of the clock signal, and the sequential circuit set is configured to receive a level of the second power voltage while the level of the second power voltage is gradually reduced by the test device for a certain time.

17. The TEG of claim 16, further comprising:
a second divider configured to receive the first power voltage and configured to divide the test signal received from the sequential circuit set and output a second divided signal.

18. The TEG of claim 17, wherein a division ratio of the second divider is determined to match an electrical performance of the test device and is different from a division ratio of the first divider.

19. The TEG of claim 16, wherein the sequential circuit set comprises at least one sequential circuit corresponding to at least one circuit included in the semiconductor die.

20. The TEG of claim 16, wherein the sequential circuit set comprises a plurality of inverters configured to reduce an amplitude of at least one of the clock signal, the first divided signal, and the test signal, the reducing being based on the level of the second power voltage being reduced.

* * * * *